United States Patent [19]
Lee et al.

[11] Patent Number: 6,074,960
[45] Date of Patent: Jun. 13, 2000

[54] METHOD AND COMPOSITION FOR SELECTIVELY ETCHING AGAINST COBALT SILICIDE

[75] Inventors: Whonchee Lee; Yongjun Jeff Hu, both of Boise, Id.

[73] Assignee: Micron Technology, Inc., Boise, Id.

[21] Appl. No.: 08/914,935

[22] Filed: Aug. 20, 1997

[51] Int. Cl.[7] .................................................. H01L 21/302
[52] U.S. Cl. ............................................ 438/749; 438/754
[58] Field of Search .................................... 438/721, 453, 438/755, 710, 586, 685, 754, 682, 683, 663, 664

[56] References Cited

U.S. PATENT DOCUMENTS

| | | | |
|---|---|---|---|
| 4,528,066 | 7/1985 | Merkling et al. | 438/721 |
| 5,010,032 | 4/1991 | Tang et al. | 438/228 |
| 5,047,367 | 9/1991 | Wei et al. | 437/200 |
| 5,086,017 | 2/1992 | Lu | 438/586 |
| 5,163,259 | 11/1992 | Kolar et al. | 437/192 |
| 5,198,382 | 3/1993 | Campbell et al. | 437/46 |
| 5,302,552 | 4/1994 | Duchateau et al. | 437/200 |
| 5,482,895 | 1/1996 | Hayashi et al. | 437/200 |
| 5,510,292 | 4/1996 | Hayashi | 438/720 |
| 5,567,651 | 10/1996 | Berti et al. | 438/303 |
| 5,593,924 | 1/1997 | Apte et al. | 437/200 |
| 5,635,426 | 6/1997 | Hayashi et al. | 438/453 |
| 5,736,461 | 4/1998 | Berti et al. | 438/651 |
| 5,880,033 | 3/1999 | Tsai | 438/710 |

OTHER PUBLICATIONS

Goto et al., "Optimization of Salicide Processes for sub 0.1 – μm CMOS Devices", *1994 Symposium on VLSI Technology Digest of Technical Papers*, pp. 119–120.

Ohguro et al., "Nitrogen–doped nickel monosilicide technique for deep submicron CMOS salicide", *International Electron Devices Meeting*, Washington, D.C., Dec. 10–13, 1995, pp. 10.3.1–10.3.4.

*Primary Examiner*—Benjamin L. Utech
*Assistant Examiner*—Duy-Vu Deo
*Attorney, Agent, or Firm*—Mueting, Raasch & Gebhardt, P.A.

[57] ABSTRACT

An etching method for use in integrated circuit fabrication includes providing a metal nitride layer on a substrate assembly, providing regions of cobalt silicide on first portions of the metal nitride layer, and providing regions of cobalt on second portions of the metal nitride layer. The regions of cobalt and the second portions of the metal nitride layer are removed with at least one solution including a mineral acid and a peroxide. The mineral acid may be selected from the group including HCl, $H_2SO_4$, $H_3PO_4$, $HNO_3$, and dilute HF (preferably the mineral acid is HCl) and the peroxide may be hydrogen peroxide. Further, the removal of the regions of cobalt and the second portions of the metal nitride layer may include a one step process or a two step process. In the one step process, the regions of cobalt and the second portions of the metal nitride layer are removed with a single solution including the mineral acid and the peroxide. In the two step process, the regions of cobalt are removed with a first solution containing a mineral acid and a peroxide and the second portions of the metal nitride layer are removed with a second solution containing a peroxide. An etching composition including a mineral acid and a peroxide, preferably, HCl and hydrogen peroxide, is also described. The etching methods and compositions may be used in forming structures such as word lines, gate electrodes, local interconnects, etc.

42 Claims, 6 Drawing Sheets

METHOD AND COMPOSITION FOR SELECTIVELY ETCHING AGAINST COBALT SILICIDE

FIELD OF THE INVENTION

The present invention relates to methods of semiconductor fabrication. More particularly, the present invention relates to etching methods which remove materials in the presence of cobalt silicide.

BACKGROUND OF THE INVENTION

Metal Oxide Semiconductor (MOS) devices are widely used in integrated circuit devices. Such MOS devices may include memory devices which are comprised of an array of memory cells. Each memory cell is comprised of a capacitor, on which the charge stored represents the logical state of the memory cell. Conductors, referred to as word lines, serve as gate electrodes of multiple access transistors which provide access to the memory cells. In a DRAM (Dynamic Random Access Memory), a word line typically is fabricated on a p-type silicon substrate coated with a thin film of silicon dioxide, known as the gate oxide. Word lines conventionally are formed on the gate oxide layer as a two-layer stack, typically including polysilicon and a conductor material such as tungsten silicide or titanium silicide (commonly referred to as a polycide word line). Further, polycide structures are also used for local interconnects in MOS devices. For example, such polycide structures may be used for the local interconnection of gates and drains in a SRAM (Static Random Access Memory).

Minimizing resistivity throughout the word line or other interconnect structures is of importance to meet the need of reducing time constants and allowing access of memory cells in as short a time period as possible. As memory density increases, feature sizes, including line sizes, decrease. For example, when the feature size of a conductor, such as a local interconnect or a word line, is reduced in a high density memory, the Kelvin contact resistance of the conductor increases. Thin tungsten silicide and titanium silicide are larger grain materials that contribute to a very rough silicide/silicon interface. As such, it reduces the effective ohmic contact area. Therefore, it is desirable to utilize conductors that have smaller grain sizes and as such, whose resistivity will not significantly increase for the same feature dimensions.

Cobalt silicide ($CoSi_2$) is a suitable conductor material for the local interconnect and word line applications. Cobalt silicide is a fine grained material having a low bulk resistivity. Cobalt silicide is therefore, well suited for conductor applications, such as word line, local interconnect, bit line, or other conductor applications in the fabrication of MOS devices. However, cobalt silicide can be difficult to pattern using conventional dry etch processes because such processes produce nonvolatile cobalt fluorides and chlorides. Further, conventional methods of patterning cobalt silicide word lines such as for DRAMs may require extra masks to pattern insulating layers or spacers used in the fabrication of such memories.

Therefore, there is a need for methods of etching in the fabrication of stacks including cobalt silicide, e.g., word lines and local interconnects, which overcome the disadvantages described above, along with other problems as will be apparent from the description below. For example, the etch methods should be suitable for patterning deep submicron cobalt silicide lines resulting in straight sidewalls for such structures.

SUMMARY OF THE INVENTION

An etching method for use in integrated circuit fabrication according to the present invention includes providing a metal nitride layer on a substrate assembly, providing regions of cobalt silicide on first portions of the metal nitride layer, and providing regions of cobalt on second portions of the metal nitride layer. The regions of cobalt and the second portions of the metal nitride layer are removed with at least one solution including a mineral acid and a peroxide.

In various embodiments of the method, the mineral acid may be selected from the group including HCl, $H_2SO_4$, $H_3PO_4$, $HNO_3$, and dilute HF (preferably the mineral acid is HCl); the peroxide may be hydrogen peroxide; the removing step may include removing the regions of cobalt and the second portions of the metal nitride layer with a single solution including a mineral acid and a peroxide; and/or the removing step may include the two steps of removing the regions of cobalt with a first solution containing a mineral acid and a peroxide and removing the second portions of the metal nitride layer with a second solution containing a peroxide.

In another method according to the present invention for use in patterning a stack including cobalt silicide, the method includes providing a layer of cobalt, regions of silicon, and a conductive diffusion barrier. The layer of cobalt and regions of silicon are reacted using thermal processing resulting in the stack including cobalt silicide and the conductive diffusion barrier and further resulting in unreacted cobalt overlying removable regions of the conductive diffusion barrier. The unreacted cobalt and removable regions of the conductive diffusion barrier are removed using at least one solution including a mineral acid and a peroxide.

An etching composition according to the present invention includes a mineral acid and a peroxide. Preferably, the mineral acid is HCl and the peroxide is hydrogen peroxide. More preferably, the composition includes a ratio in the range of about 1:1:35 (mineral acid:peroxide:deionized water) to about 1:1:5 (mineral acid:peroxide:deionized water).

Further, the above generally described methods may be used in forming structures such as word lines, gate electrodes, local interconnects, etc.

BRIEF DESCRIPTION OF THE DRAWINGS

FIG. 1 is an illustrative diagram showing layers on a semiconductor substrate assembly. FIG. 2 is an illustrative diagram showing layers on a semiconductor substrate assembly after patterning with a masking layer and removal of material. FIG. 3 is an illustrative diagram showing layers on a semiconductor substrate assembly after thermal treatment to form cobalt silicide on a first portion of a metal nitride layer. FIG. 4 is an illustrative diagram showing layers on a semiconductor substrate assembly after removing exposed cobalt on a second portion of the metal nitride layer. FIG. 5 is an illustrative diagram showing layers on a semiconductor substrate assembly after removing the second portion of the metal nitride layer.

DETAILED DESCRIPTION OF THE EMBODIMENTS

Figure 1:
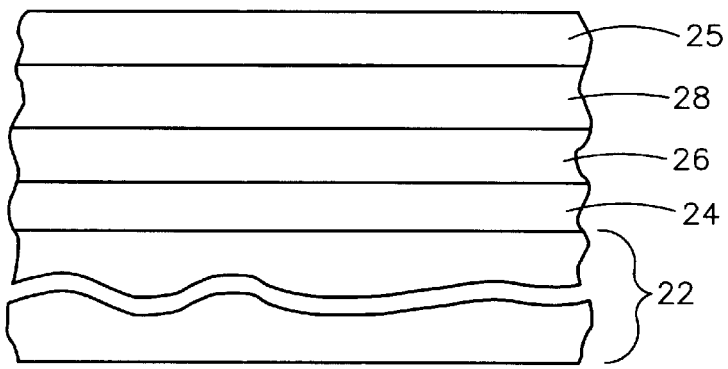
FIGS. 1–5 are illustrative diagrams showing an etching process for removal of materials in the presence of cobalt silicide.

The present invention shall be generally described with reference to FIGS. 1–5. Thereafter, the use of the present invention for illustrative fabrication processes shall be described with reference to FIGS. 6 and 7. With the description as provided below, it is readily apparent to one skilled in the art that the various processes described with respect to the figures may be utilized in various configurations and for various applications. For example, the present invention may be used in the formation of word lines, bit lines, local interconnects, etc. for various memory circuits. Further, for example, the present invention may be particularly beneficial in the fabrication of word line gate electrodes of DRAM's or for local interconnects of SRAM's.

In this application, "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon. When reference is made to a substrate assembly in the following description, various process steps may have been previously utilized to form regions/junctions in the semiconductor substrate thereof. It should be apparent that scaling in the Figures does not represent precise dimensions of the various elements illustrated therein.

As described in further detail with reference to FIG. 1, a stack of metal nitride 24, cobalt 26, silicon 28, and an optional cap layer 25 are formed sequentially on the substrate assembly 22. The stack may be formed on any semiconductor substrate or substrate assembly. For example, the underlayer over which the stack is formed (i.e., the upper portion of the substrate assembly 22) may be polysilicon for forming a word line gate electrode as further described herein or may be an oxide and/or a silicon containing region in the formation of a local interconnect.

The stack is formed on the substrate assembly by first depositing a metal nitride layer 24 (e.g., titanium nitride or $WSi_xN_y$). The metal nitride functions as a conductive diffusion barrier. The metal nitride layer ranges in thickness from about 50 Å to about 500 Å. The metal nitride layer is deposited by sputtering or chemical vapor deposition (CVD), as is known by one of skill in the art. For example, a titanium nitride layer can be formed by evaporating the titanium in a nitrogen ambient atmosphere, by reactively sputtering titanium in an argon and nitrogen atmosphere, by sputtering from a titanium nitride target in an inert ambient atmosphere, by sputter depositing titanium in an argon ambient and converting it to titanium nitride in a separate plasma nitridation step, or by chemical vapor deposition. Preferably, the metal nitride is $WSi_xN_y$, or titanium nitride, and more preferably titanium nitride. However, any conductive diffusion barrier material may be used.

Over the metal nitride layer 24, cobalt 26 is deposited at various thicknesses depending upon the use of the substrate assembly and the desired resistance of the resulting cobalt silicide. Typically, the cobalt layer 26 ranges in thickness from about 50 Å to about 1000 Å. The cobalt layer 26 may be deposited by sputtering, evaporation, physical vapor deposition (PVD) or chemical vapor deposition (CVD). For example, in a sputtering process for cobalt, the process may be performed by using argon gas as the sputtering gas at a particular flow rate, with the application of an RF power for achieving the desired deposition in a pressurizable sputtering chamber. However, it should be readily apparent that any manner of forming the cobalt layer is contemplated in accordance with the present invention and is in no manner limited to any particular process, e.g., sputtering, for formation thereof. Preferably, for word line gate electrode applications or local interconnect applications, the cobalt layer 26 ranges in thickness from about 50 Å to about 1000 Å.

A silicon layer 28 is then deposited over the cobalt layer 26 by methods known in the art. The silicon layer 28 may be either doped or undoped polysilicon or amorphous silicon. A polysilicon layer can be formed by any conventionally known method, such as by chemical vapor deposition or even by growth of polysilicon or silicon. For example, the polysilicon can be deposited using silicon hydrides or silanes such as dichlorosilane (DCS, $SiH_2Cl_2$), silane ($SiH_4$), disilane ($H_3SiSiH_3$), trichlorosilane (TCS, $SiHCl_3$), or any other silicon precursor known to one skilled in the art. One illustration of the deposition of polysilicon includes the decomposition of silane at a low pressure in the range of about 0.2 torr to about 1 torr at a temperature greater than 550° C. However, the temperature and pressure will vary depending on the other parameters of the system for deposition of the polysilicon. For example, a greater pressure may require the need for a higher temperature to deposit the polysilicon. Further, the deposition of polysilicon may be accomplished by depositing silicon as an amorphous film and then recrystallizing the film to form polysilicon. Preferably, the silicon layer ranges in thickness from about 150 Å to about 4000 Å.

Depending upon the desired application for the structure fabricated in accordance with the present invention, an optional cap layer 25 is formed over the silicon layer 28. For example, in the fabrication of a word line gate electrode, the cap layer 25 is used. On the other hand, in the fabrication of a local interconnect, the cap layer 25 is not used. Further, in the fabrication of a word line gate electrode, the cap layer 25 is an insulating layer, such as, for example, silicon nitride, $SiO_xN_y$, or an oxide, such as, for example, BPSG, silicon dioxide, TEOS, etc. The optional cap layer 25 is deposited over the silicon layer 28 and ranges in thickness, preferably from about 300 Å to about 3000 Å. The cap layer 25 is deposited by any method for the desired cap material as are readily known in the art.

Figure 2:
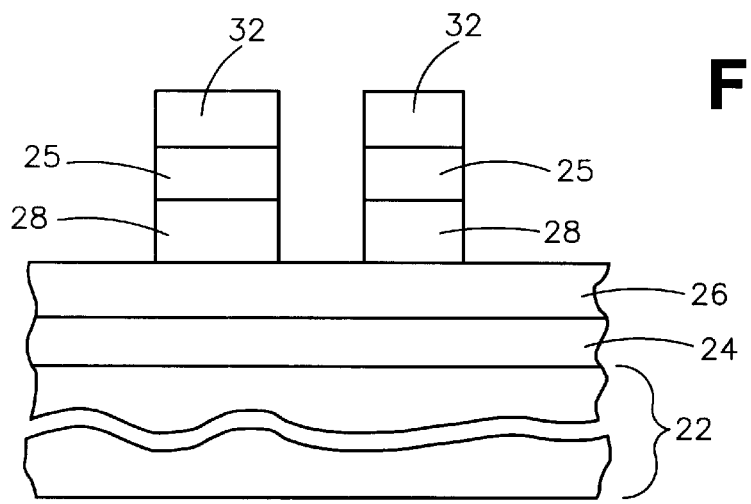

With the stack shown in FIG. 1 and formed as described above, conventional photolithography processing is used to pattern the stack as illustrated in FIG. 2. Patterning, as used herein, is defined as both the exposing of resist and the combination of exposing and removing of resist and other material to define desired structures. It can also mean any other type of method whereby patterns may be defined and created.

The stack as shown in FIG. 1 is patterned, for example, by radiation based lithography using a masking layer 32 to define a structure, e.g., a word line gate electrode or a local interconnect, as shown in FIG. 2. The photoresist used is suitable for the radiation used to expose such photoresist. Portions of the layers forming the stack which are not covered by the masking layer 32 are removed by conventional methods stopping at the cobalt layer 26. For example, portions of the optional cap layer 25 and the silicon layer 28 which are exposed after the application of mask layer 32, are removed by etching, such as by dry etching, down to the cobalt layer 26. Further, for example, the dry etching may be accomplished with plasma etching, reactive ion etching, or a combination thereof. FIG. 2 illustrates removal of unmasked portions of the optional cap layer 25 and the silicon layer 28. In general, suitable dry etch processes may use chlorine or fluorine based gases, such as $NF_3$, $CF_4$, and $CCl_4$ to remove portions of the exposed, i.e., unmasked, layers. Because cobalt fluorides and chlorides are nonvolatile, the dry etch process stops at the cobalt layer 26. Therefore, the cobalt layer 26 functions as a dry etch stop.

After the exposed portions of the optional cap layer 25 and the silicon layer 28 are removed, the remaining masking layer 32 is also removed by techniques known in the art. For example, an oxygen ash may be used for removal of the remaining mask, or any other resist removal method may be used.

Figure 3:
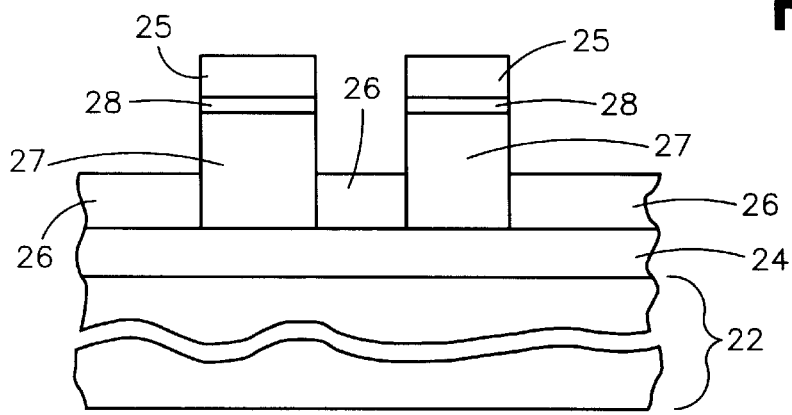
Figure 4:
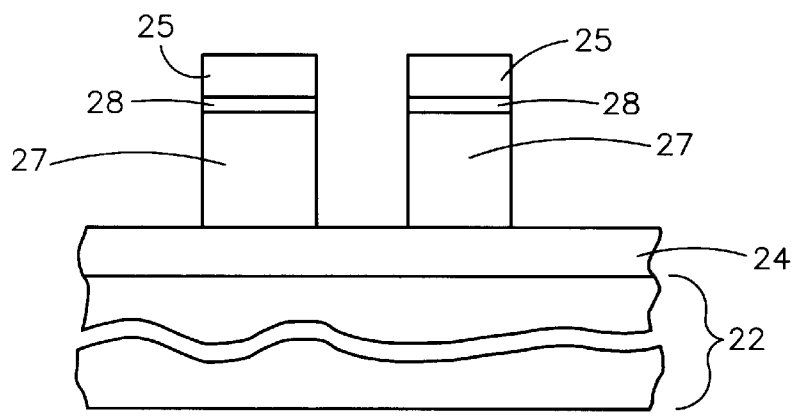

The remaining structure formed on the substrate assembly 22 is subjected to thermal processing, to produce the layers illustrated in FIG. 3. Thermal processing causes the cobalt to form cobalt silicide regions 27 in a process referred to as a silicidation anneal. The cobalt silicide regions are formed on portions of the metal nitride layer corresponding to the patterned silicon layer 28. Thus, portions of the cobalt layer 26 remain unreacted on other portions of the metal nitride layer corresponding to portions of the silicon layer 28 removed during patterning of the layer 28.

The silicidation anneal may be a rapid thermal process (RTP) in the temperature range of about 550° C. to about 850° C. for a time ranging from about 10 to about 90 seconds to convert the cobalt 26 to its silicide 27. It should be apparent that the thermal treatment will vary depending upon various factors such as the thickness of the cobalt layer, resistivity desired, etc. The thermal treatment may also be a conventional furnace anneal as opposed to an RTP anneal and further may include various steps, whether furnace or RTP anneal, in temperature and duration. In one preferred silicidation anneal, silicidation occurs at about 750° C. for about 20 seconds in a nitrogen atmosphere.

During the silicidation process, straight sidewall profiles of the silicon layer 28 are preserved. The thickness of the silicon is preferably in the range of about 150 Å to about 4000 Å, more preferably about 3.7 times the thickness of the cobalt. Preferably, a sufficient thickness of the silicon layer 28 is formed so that a portion of the silicon layer 28 is not converted to the cobalt silicide regions 27. The unconverted silicon layer 28 facilitates connection of the formed structure to other conductive structures.

Figure 5:
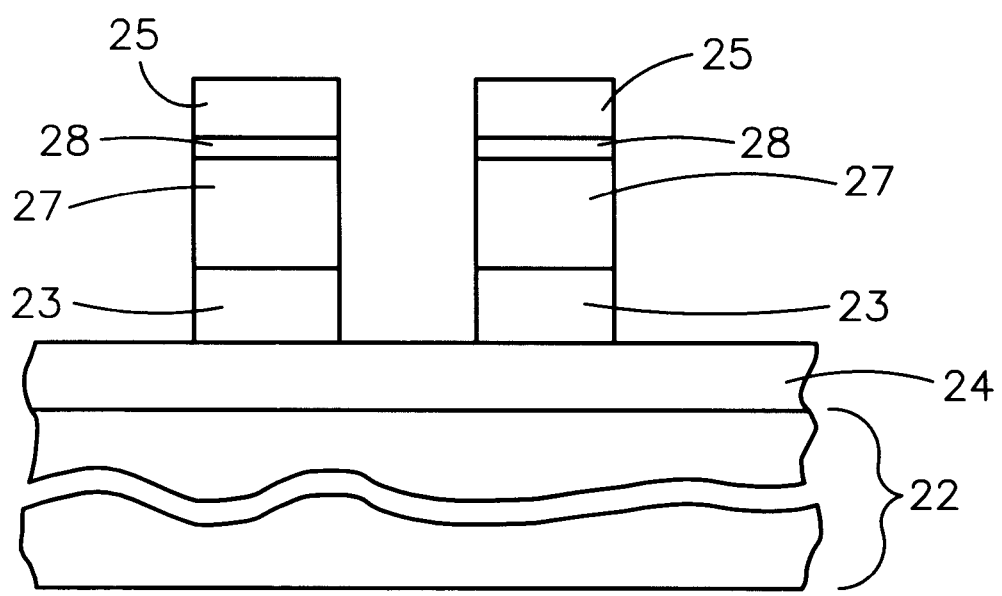

The optional cap layer 25, the patterned silicon layer 28, and the cobalt silicide regions 27 act as a mask to the underlying portions of the metal nitride layer 24. The unreacted cobalt 26 overlying certain portions of the metal nitride layer 24 as illustrated in FIG. 3 are removed. The removal of the unreacted cobalt is performed by wet etching carried out in the unmasked areas resulting in the structure of FIG. 4. Continued etching removes the portions of the metal nitride layer 24 underlying the unreacted cobalt leaving the portions of the metal nitride layer 23 underlying the cobalt silicide regions unetched, as illustrated in FIG. 5.

In accordance with the present invention, the wet etching of unreacted cobalt and underlying metal nitride portions is performed using either a single step embodiment using a single solution including a mineral acid and a peroxide, or is performed using two solutions in a two step process. In the two step embodiment of the present invention, a first solution including a mineral acid and a peroxide (like the single solution used in the single step embodiment, but more dilute) is used to remove the unreacted cobalt using the underlying metal nitride portions as an etch stop. Thereafter, a second solution including a peroxide and optionally containing a mineral acid is used to remove the then exposed metal nitride portions.

In both the single solution embodiment and two step embodiment for removal of the unreacted cobalt and the underlying metal nitride portions, etching is carried out at temperatures ranging from about 20° C. to about 100° C. Optimum temperatures are determined empirically and are at least in part determined based upon desired etch rates for the materials being removed. For example, for a preferred etch rate for etching unreacted cobalt of about 100 Å/minute to about 200 Å/minute, an optimum temperature of about 30° C. is determined for the first solution of the two step embodiment. It should be readily apparent that the temperature may be adjusted during the etching process and further that the temperature of each step in the two step embodiment may differ.

Preferred etch rates for the single solution embodiment include rates greater than about 1000 Å/minute for unreacted cobalt and rates of about 50 Å/minute to about 250 Å/minute for removal of the metal nitride. Preferred etch rates for the two step embodiment include a range of about 50 Å/minute to about 500 Å/minute for etching cobalt and a range of about 50 Å/minute to about 250 Å/minute for removal of the metal nitride portions.

Suitable mineral acids for either the one step or two step etching embodiments include HCl, $HNO_3$, $H_2SO_4$, $H_3PO_4$, and dilute HF (i.e., about or more dilute than 200:1 $H_2O$:HF). A preferred mineral acid is HCl. Mineral acids are commercially available as concentrated solutions (X) which then typically are diluted to a desired concentration ($H_2O$:X). For example, commercially available concentrated acids are available as follows: HCl is 37% by weight in deionized water; $HNO_3$ is 70% by weight in deionized water; $H_2SO_4$ is 96% by weight in deionized water; $H_3PO_4$ is 85% by weight in deionized water; and HF is 49% by weight in deionized water. HF is particularly aggressive at dissolving oxide layers, thus dilute HF (i.e., about or more dilute than 200:1 $H_2O$:HF) is suitable in the practice of this invention. Concentrations of solutions described herein are given based on the commercially available solutions. For example, if the solution has a concentration of 30% HCl, then the solution includes 30% by weight of the commercially available HCl solution.

Suitable peroxides include hydrogen peroxide and potentially ozone. Preferably, hydrogen peroxide is used. Hydrogen peroxide is commercially available as a concentrated solution, approximately 29% by weight in deionized water.

The concentrated solutions of mineral acids and the peroxide are diluted by volume in deionized water in the desired proportion. For the one step method, the single solution includes a ratio in the range of about 1:1:35 (mineral acid:peroxide:deionized water) to about 1:1:5 (mineral acid:peroxide:deionized water); more preferably a ratio in the range of about 1:1:25 (mineral acid:peroxide:deionized water) to about 1:1:10 (mineral acid:peroxide:deionized water), and preferably at a ratio of about 1:1:15 (mineral acid:peroxide:deionized water).

For the two step embodiment, the first solution for removal of the unreacted cobalt includes a ratio in the range of about 1:1:300 (mineral acid:peroxide:deionized water) to about 1:1:70 (mineral acid:peroxide:deionized water), more preferably a ratio in the range of about 1:1:200 (mineral acid:peroxide:deionized water) to about 1:1:100 (mineral acid:peroxide:deionized water), and preferably at a ratio of about 1:1:1 00 (mineral acid:peroxide:deionized water). Note that this solution including a mineral acid and a peroxide is more dilute than the single solution used in the one step embodiment.

The second solution for the two step embodiment for removal of the metal nitride portions includes a ratio in the range of about 1:50 (peroxide:deionized water) to about 1:1 (peroxide:deionized water), more preferably a ratio in the range of about 1:10 (peroxide:deionized water) to about 1:5 (peroxide:deionized water), and preferably at a ratio of about 1:6 (peroxide:deionized water).

If the second solution includes an optional mineral acid, then the second solution includes a ratio in the range of about 0.05:1:6 (mineral acid:peroxide:deionized water) to about 1:1:6 (mineral acid:peroxide:deionized water); more preferably a ratio in the range of about 0.1:1:6 (mineral acid:peroxide:deionized water) to about 0.5:1:6 (mineral acid:peroxide:deionized water), and preferably at a ratio of about 0.1:1:6 (mineral acid:peroxide:deionized water).

The above ranges for the ratios of the various solutions are particularly applicable when the mineral acid is HCL and the peroxide is $H_2O_2$.

Deionized water for the practice of this invention is formed by standard ion exchange and/or distillation techniques, as are known to one of skill in the art. A suitable deionized water used in the production of integrated circuit components typically exhibits a conductivity ranging from about 12 to 18 megaohms.

In one embodiment of the present invention, an aqueous solution of HCl and hydrogen peroxide is used for a time and at a temperature sufficient to etch the cobalt layer, e.g., in the first step of the two step embodiment. For example, a solution diluted by volume to a ratio of 1:1:100 ($HCl:H_2O_2:H_2O$) selectively etches a cobalt layer at a rate of about 800 Å/minute against a TiN layer at 30° C. (i.e., little or no etching of the TiN layer); a solution diluted by volume to a ratio of 1:1:70 ($HCl:H_2O_2:H_2O$) etches a cobalt layer at a rate greater than about 2000 Å/minute against a TiN layer at 30° C. (with etching of the TiN layer of about 1 Å/minute); a solution diluted by volume to a ratio of 1:1:35 ($HCl:H_2O_2:H_2O$) etches a cobalt layer at a rate greater than 4000 Å/minute against a TiN layer at 30° C. (with etching of the TiN layer of about 8 A/minute). A temperature greater than 30° C. may result in dissolving of the TiN. In the two step process, the etching of the cobalt against the TiN is mainly determined by the peroxide concentration and temperature.

In another embodiment, an aqueous solution containing hydrogen peroxide and HCl, for a time and at a temperature sufficient to remove cobalt and the metal nitride layer is used. For example, an HCl and hydrogen peroxide containing solution of a ratio of 0.1:1:6 ($HCl:H_2O_2:H_2O$) at 65° C. selectively etches a cobalt layer against TiN at a rate of about 8000 Å/min and etches a TiN layer against cobalt silicide at a rate of about 90 Å/min to about 180 Å/min.

It is noted that the etch rate of cobalt in a solution of a ratio of 1:3 (HCl:deionized water) decreases with soaking time but slightly increases with temperature, suggesting that the rate limiting step for a cobalt etch in such a solution is the oxidation of cobalt to cobalt oxide but is not the dissolution of cobalt oxide in the acid media. As such, such a solution does not etch cobalt at a rate that is extremely beneficial, although the selectivity to the metal nitride is very good, e.g. typically no metal nitride is removed. For example, for a solution of a ratio of 1:3 (HCl:deionized water), the etch rate of cobalt for 1 minute is about 97 Å/minute, for 5 minutes is 20 Å/minute, and for 10 minutes is only 13 Å/minute (at a temperature of 35° C. Further, for example, for a solution of a ratio of 1:3 (HCl:deionized water), the etch rate of cobalt at 35° C. is about 20 Å/minute, at 45° C. is about 23 Å/minute, at 55° C. is about 29 Å/minute, and at 65° C. is about 34 Å/minute (for 5 minutes at each temperature). In both circumstances, no etching of the metal nitride occurs.

The processes described above are particularly useful for fabrication of DRAM word line gate electrodes and SRAM local interconnect applications. FIGS. 6 and 7 generally show the processes used in several illustrative embodiments. However, it should be readily apparent to one skilled in the art that the processes described above can be used for various other applications. Therefore, it is recognized that the following embodiments are for illustration only and not to be read as unduly limiting to the scope of the present invention.

Figure 6A:
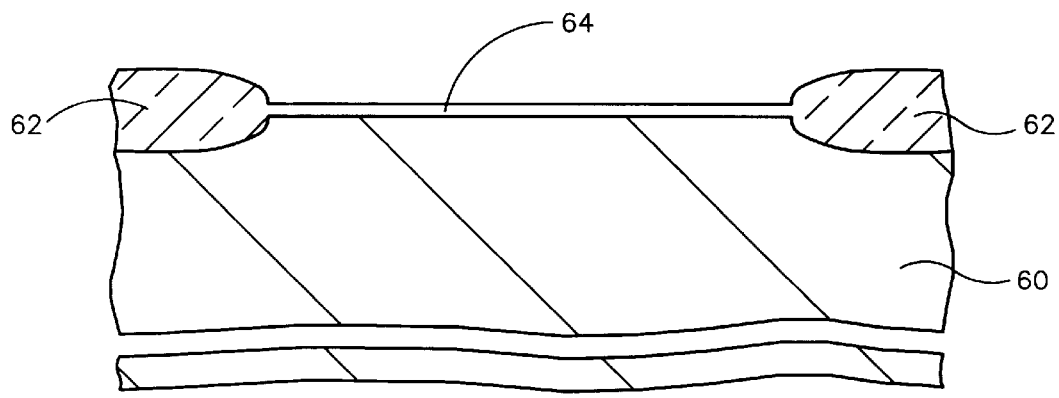
FIGS. 6A–6C are illustrative diagrams showing use of the present invention in the fabrication of a word line.
Figure 6B:
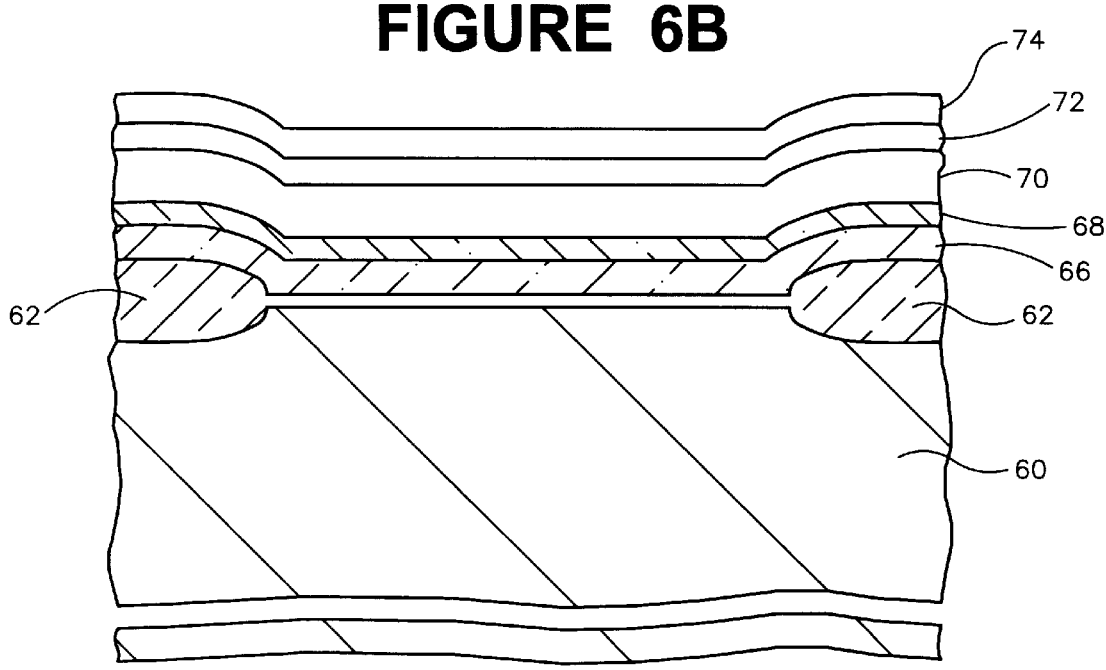
Figure 6C:
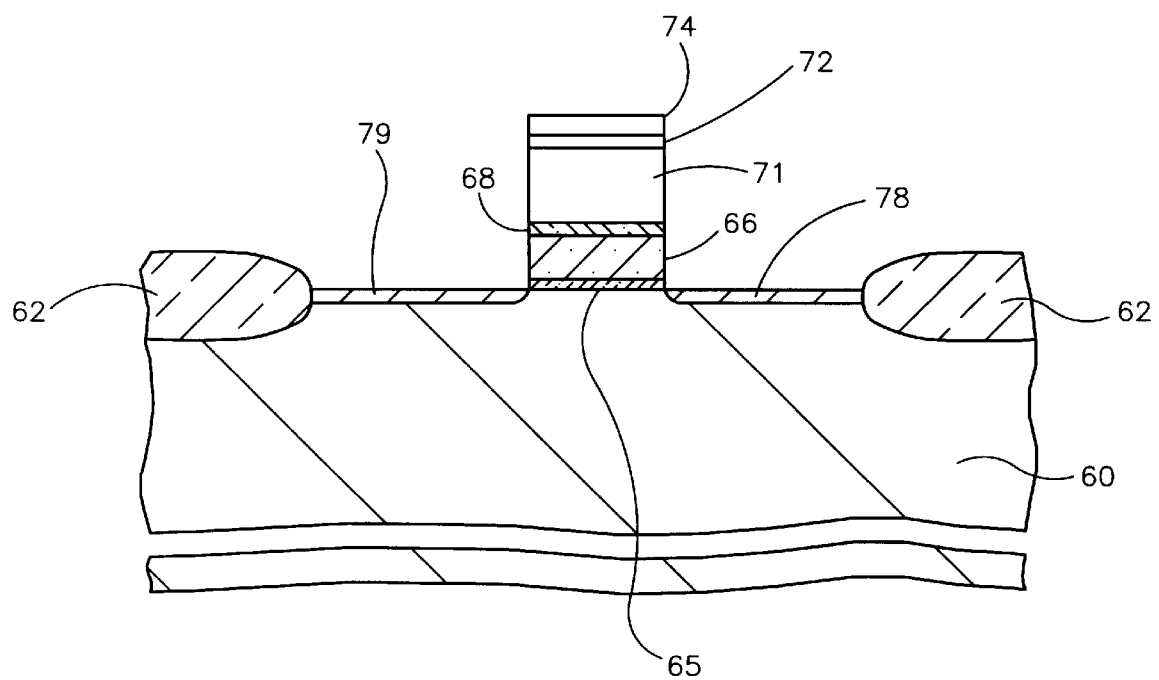

FIGS. 6A–6C illustrate fabrication of a word line (FIG. 6C) in a dynamic random access memory device. FIG. 6A includes field oxide regions 62 formed on substrate 60 such as, for example, by conventional local oxidation of silicon (LOCOS) processing. Further, a gate insulating layer, i.e., a gate oxide 64, is formed on semiconductor substrate 60 in the active area formed by field oxide regions 62. Semiconductor substrate 60 refers to the base semiconductor layer, e.g., a base layer of silicon material of the device or wafer or a silicon layer formed on another material such as silicon on sapphire.

As shown in FIG. 6B, a layer of polysilicon 66 is formed over the field oxide regions 62 and gate oxide 64. The polysilicon layer 66 can be formed by any conventionally known method, such as by chemical vapor deposition or even by growth of polysilicon. A layer of TiN 68 is then formed over the polysilicon layer 66. Thereafter, as previously described herein, a layer of cobalt 70, a layer of silicon 72, and a cap layer 74 are formed sequentially over the TiN layer 68.

Thereafter, as generally described herein with reference to FIGS. 1–5, the cap layer 74 and silicon layer 72 are patterned resulting in portions of the layer of silicon 72 over first portions of the cobalt layer 70 overlying first portions of the metal nitride layer 68 to define the word line at least in part over the gate oxide 64 in the active area of the memory device. This also results in second exposed portions of the cobalt layer 70 overlying second portions of the metal nitride layer 68. An anneal is performed to react the first portions of the cobalt layer 70 with the overlying portions of the patterned silicon layer 72 to form cobalt silicide.

The second portions, i.e., the unreacted portions, of cobalt layer 70 and the second portions of the metal nitride layer underlying the unreacted portions of cobalt are removed according to the one step or two step embodiment for etching in the presence of cobalt silicide as described above. In other words, a single solution including HCl and hydrogen peroxide can be used to remove the unreacted cobalt and the underlying TiN portions, or two solutions may be used. With use of the two solutions, a first solution including HCl and hydrogen peroxide is used to etch the cobalt, and a second solution including hydrogen peroxide is used to etch the TiN.

Such etching of the portions of the TiN layer 68 exposes portions of the polysilicon layer 66. The polysilicon layer 66 is then etched using the stack of TiN 68, cobalt silicide 71, silicon 72 and cap 74 as a mask. For example, the portions of the polysilicon layer 66 exposed, i.e., not masked by the stack, can be dry etched with use of a fluorine or chlorine containing plasma gas. The resulting structure is the word line shown in FIG. 6C. The gate region 65 may then be formed by etching portions of the gate oxide layer 64 in a conventional manner. Further conventional processing may be utilized to implant source 78 and drain 79 regions of the transistor structure and further form other features of the semiconductor device.

It should be readily apparent to one skilled in the art that a bit line may be formed in much the same manner as the word line. Further, the formation of the various layers, whether metal nitride, oxide, polysilicon, or others as described above, may be formed in many different manners, with various types of apparatus, and at various parameters in the processes for forming such layers. Any conventional method of forming such layers is contemplated in accordance with the present invention.

Figure 7A:
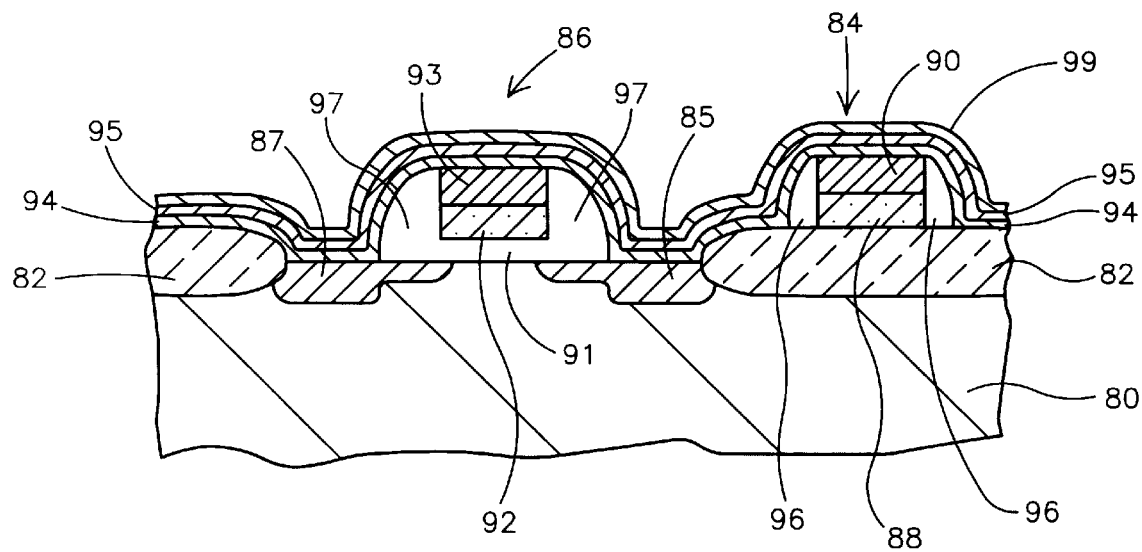
FIGS. 7A and 7B are illustrative diagrams showing use of the present invention in fabrication of a local interconnect.
Figure 7B:
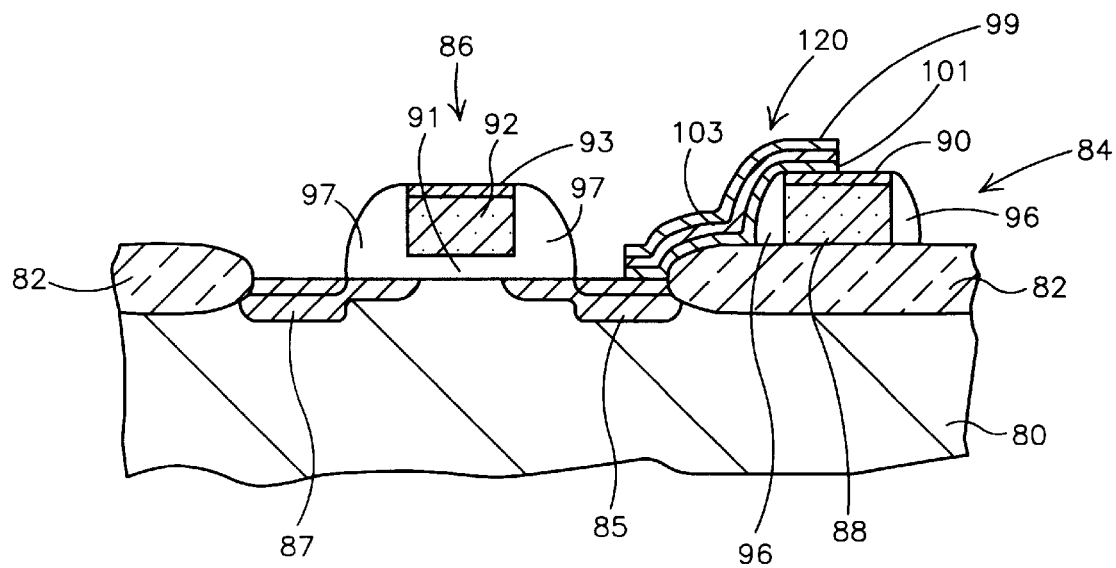

FIG. 7A–7B illustrates fabrication of a local interconnect such as for an SRAM device. FIG. 7A shows field oxide regions 82 formed on substrate 80 isolating an active area wherein source region 87 and drain region 85 are formed such as by implantation after formation of gate structure 86. The gate structure 86 includes polysilicon region 92 and metal silicide region 93 of the gate electrode, and further includes spacers 97 and gate oxide 91. A bit line 84 is also formed including polysilicon region 88 and metal silicide region 90 with spacers 96 formed at the sides thereof. At the surface of this particular structure, a local interconnect 120 (FIG. 7B) is formed for connecting the drain 85 to the bit line 84.

As shown in FIG. 7A, a TiN layer 94 is formed over the various device structures. Thereafter, a cobalt layer 95 is formed over the TiN layer 94 and a silicon layer 99 is formed over the cobalt layer 95. Photolithography is utilized to pattern the silicon layer 99 exposing portions of the underlying cobalt layer 95. As previously described with reference to FIGS. 1–5, the patterned structure is annealed to form cobalt silicide 103 where the cobalt layer 95 contacts the silicon layer 99, i.e., all portions which are not exposed. Some of the patterned silicon 99 may remain after the anneal. The unreacted cobalt and the portions of the TiN layer 94 underlying the unreacted portions are then removed using the one step or two step process as described herein with reference to FIGS. 1–5. The resulting structure is a local interconnect 120 connecting the drain 85 to the bit line 84.

It is readily apparent that the local interconnect can be formed to connect various elements of the structure of a device and that the present invention is in no manner limited to the illustration shown in FIGS. 7A–7B. For example, a local interconnect may be made between various regions of one or more device structures, i.e., connection of a source and drain of a pair of transistors.

Although the invention has been described above with particular reference to various embodiments thereof, variations and modifications of the present invention can be made within a contemplated scope of the following claims.

What is claimed is:

1. An etching method for use in integrated circuit fabrication, the method comprising the steps of:
   providing a metal nitride layer on a substrate assembly;
   providing regions of cobalt silicide on first portions of the metal nitride layer;
   providing regions of cobalt on second portions of the metal nitride layer; and
   removing the regions of cobalt and the second portions of the metal nitride layer with at least one solution including a mineral acid and a peroxide.

2. The method according to claim 1, wherein the mineral acid is selected from the group consisting of HCl, $H_2SO_4$, $H_3PO_4$, $HNO_3$, and dilute HF.

3. The method according to claim 2, wherein the mineral acid is HCl.

4. The method according to claim 1, wherein the peroxide is hydrogen peroxide.

5. The method according to claim 1, wherein the removing step includes removing the regions of cobalt and the second portions of the metal nitride layer with a single solution including a mineral acid and a peroxide.

6. The method according to claim 1, wherein the removing step includes:
   removing the regions of cobalt with a first solution containing a mineral acid and a peroxide; and
   removing the second portions of the metal nitride layer with a second solution containing a peroxide.

7. An etching method for use in integrated circuit fabrication, the method comprising the steps of:
   providing a metal nitride layer on a substrate assembly;
   providing regions of cobalt silicide on first portions of the metal nitride layer;
   providing regions of cobalt on second portions of the metal nitride layer; and
   removing the regions of cobalt and the second portions of the metal nitride layer with a solution including a mineral acid and a peroxide.

8. The method according to claim 7, wherein the mineral acid is selected from the group consisting of HCl, $H_2SO_4$, $H_3PO_4$, $HNO_3$, and dilute HF.

9. The method according to claim 8, wherein the mineral acid is HCl.

10. The method according to claim 7, wherein the peroxide is hydrogen peroxide.

11. The method according to claim 7, wherein the solution includes a ratio in a range of about 1:1:35 (mineral acid:peroxide:deionized water) to about 1:1:5 (mineral acid:peroxide:deionized water).

12. The method according to claim 11, wherein the solution includes a ratio in a range of about 1:1:25 (mineral acid:peroxide:deionized water) to about 1:1:10 (mineral acid:peroxide:deionized water).

13. An etching method for use in integrated circuit fabrication, the method comprising the steps of:
   providing a metal nitride layer on a substrate assembly;
   providing regions of cobalt silicide on first portions of the metal nitride layer;
   providing regions of cobalt on second portions of the metal nitride layer;
   removing the regions of cobalt with a first solution containing a mineral acid; and
   removing the second portions of the metal nitride layer with a second solution containing a peroxide.

14. The method according to claim 13, wherein the mineral acid is selected from the group consisting of HCl, $H_2SO_4$, $H_3PO_4$, $HNO_3$, and dilute HF.

15. The method according to claim 14, wherein the mineral acid is HCl.

16. The method according to claim 13, wherein the peroxide is hydrogen peroxide.

17. The method according to claim 13, wherein the first solution includes a ratio in a range of about 1:1:300 (mineral acid:peroxide:deionized water) to about 1:1:70 (mineral acid:peroxide:deionized water).

18. The method according to claim 17, wherein the first solution includes a ratio in a range of about 1:1:200 (mineral acid:peroxide:deionized water) to about 1:1:100 (mineral acid:peroxide:deionized water).

19. The method according to claim 13, wherein the second solution includes a ratio in a range of about 1:50 (peroxide:deionized water) to about 1:1 (peroxide:deionized water).

20. The method according to claim 19, wherein the second solution includes a ratio in a range of about 1:10 (peroxide:deionized water) to about 1:5 (peroxide:deionized water).

21. The method according to claim 13, wherein the second solution includes a ratio in a range of about 0.05:1:6 (mineral acid:peroxide:deionized water) to about 1:1:6 (mineral acid:peroxide:deionized water).

22. An etching method for use in integrated circuit fabrication, the method comprising the steps of:
providing a titanium nitride layer on a substrate assembly;
providing regions of cobalt silicide on first portions of the titanium nitride layer;
providing regions of cobalt on second portions of the titanium nitride layer; and
removing the regions of cobalt and the second portions of the titanium nitride layer with a solution including a mineral acid and a peroxide.

23. The method according to claim 22, wherein the mineral acid is HCl and the peroxide is hydrogen peroxide.

24. The method according to claim 23, wherein the solution includes a ratio in a range of about 1:1:35 (HCl:hydrogen peroxide:deionized water) to about 1:1:5 (HCl:hydrogen peroxide:deionized water).

25. An etching method for use in integrated circuit fabrication, the method comprising the steps of:
providing a titanium nitride layer on a substrate assembly;
providing regions of cobalt silicide on first portions of the titanium nitride layer;
providing regions of cobalt on second portions of the titanium nitride layer;
removing the regions of cobalt with a first solution containing a mineral acid and a peroxide; and
removing the second portions of the titanium nitride layer with a second solution containing a peroxide.

26. The method according to claim 25, wherein the mineral acid of the first solution is HCl and the peroxide is hydrogen peroxide.

27. The method according to claim 25, wherein the first solution includes a ratio in a range of about 1:1:300 (HCl:hydrogen peroxide:deionized water) to about 1:1:70 (HCl:hydrogen peroxide:deionized water).

28. The method according to claim 25, wherein the peroxide of the second solution is hydrogen peroxide.

29. The method according to claim 28, wherein the second solution includes a ratio in a range of about 1:50 (peroxide:deionized water) to about 1:1 (peroxide:deionized water).

30. A method for use in patterning a stack including cobalt silicide, the method comprising the steps of:
providing a layer of cobalt, regions of silicon, and a conductive diffusion barrier;
reacting the layer of cobalt and regions of silicon using thermal processing resulting in the stack including cobalt silicide and the conductive diffusion barrier and further resulting in unreacted cobalt overlying removable regions of the conductive diffusion barrier; and
removing the unreacted cobalt and removable regions of the conductive diffusion barrier using at least one solution including a mineral acid and a peroxide.

31. The method according to claim 30, wherein the removing step includes removing the unreacted cobalt using a first solution including a mineral acid and a peroxide with the removable regions of the conductive diffusion barrier being an etch stop.

32. The method according to claim 31, wherein the removing step further includes removing the removable regions of conductive diffusion barrier using a second solution including a peroxide.

33. The method according to claim 30, wherein the mineral acid is HCl and the peroxide is hydrogen peroxide.

34. A method for use in integrated circuit fabrication, the method comprising the steps of:
providing a metal nitride layer on a substrate assembly;
providing a layer of cobalt on the metal nitride layer;
providing a layer of silicon on the cobalt layer;
patterning the silicon layer resulting in exposed portions of cobalt and unexposed portions of cobalt;
performing a thermal treatment to form cobalt silicide from the unexposed portions of cobalt over first portions of the metal nitride layer with unreacted cobalt resulting over second portions of the metal nitride layer; and
removing the unreacted cobalt and the second portions of the metal nitride layer with at least one solution including a mineral acid and a peroxide.

35. The method according to claim 34, wherein the removing step includes removing the unreacted cobalt and the second portions of the metal nitride layer with a single solution including HCl and hydrogen peroxide.

36. The method according to claim 34, wherein the removing step includes:
removing the unreacted cobalt with a first solution including HCl and hydrogen peroxide; and
removing the second portions of the metal nitride layer with a second solution including hydrogen peroxide.

37. A method of forming a word line for a memory device, the method comprising the steps of:
selectively oxidizing the surface of a substrate assembly to form at least one active area and field oxide regions;
forming a gate film in the active area;
forming a conductive silicon layer over the gate film;
forming a metal nitride layer over the conductive silicon layer;
forming a cobalt layer over the metal nitride layer;
forming a layer of silicon over the cobalt layer;
forming a cap layer over the layer of silicon;
patterning the cap layer and layer of silicon over first portions of the cobalt layer overlying first portions of the metal nitride layer to define the word line at least in part over the gate film in the active area of the memory device while exposing second portions of the cobalt layer overlying second portions of the metal nitride layer;
performing an anneal to react the first portions of the cobalt layer with the layer of silicon;
removing the second portions of cobalt and the second portions of the metal nitride layer with at least one solution including a mineral acid and a peroxide, such removal resulting in exposed portions of the conductive silicon layer; and
removing the exposed portions of the conductive silicon layer.

38. The method according to claim 37, wherein the step of removing the second portions of cobalt silicide and metal nitride layer includes removing the second portions of cobalt and the second portions of the metal nitride layer with a single solution including HCl and hydrogen peroxide.

39. The method according to claim 37, wherein the step of removing the second portions of cobalt silicide and metal nitride layer includes:
removing the second portions of cobalt with a first solution including HCl and hydrogen peroxide; and removing the second portions of the metal nitride layer with a second solution including hydrogen peroxide.

40. A method of forming a local interconnect for a memory device, the method comprising the steps of:

selectively oxidizing the surface of a substrate to form one or more active areas and field oxide regions;

forming a gate region, source region, and drain region in the one or more active areas;

forming one of at least a portion of a bit line and a word line; and forming an interconnect to connect at least two of the gate region, source region, drain region, bit line, and word line, the forming of the interconnect step comprising the steps of:

forming a metal nitride layer over at least an oxide provided between the at least two of the gate region, source region, drain region, bit line, and word line, forming a cobalt layer over the metal nitride layer, forming a layer of silicon over the cobalt layer, patterning the layer of silicon over first portions of the cobalt layer overlying first portions of the metal nitride layer to define the interconnect while exposing second portions of the cobalt layer overlying second portions of the metal nitride layer, performing an anneal to react the first portions of the cobalt layer with the patterned layer of silicon, and removing the second portions of cobalt and the second portions of the metal nitride layer with at least one solution including a mineral acid and a peroxide.

41. The method according to claim 40, wherein the removing step includes removing the second portions of cobalt and the second portions of the metal nitride layer with a single solution including HCl and hydrogen peroxide.

42. The method according to claim 40, wherein the removing step includes:

removing the second portions of cobalt with a first solution including HCl and hydrogen peroxide; and removing the second portions of the metal nitride layer with a second solution including hydrogen peroxide.

* * * * *